(12) United States Patent
Niwa

(10) Patent No.: US 7,304,333 B2
(45) Date of Patent: Dec. 4, 2007

(54) SEMICONDUCTOR DEVICE

(75) Inventor: Takaki Niwa, Kanagawa (JP)

(73) Assignee: NEC Compound Semiconductor Devices, Ltd., Kawasaki-shi, Kanagawa (JP)

( * ) Notice: Subject to any disclaimer, the term of this patent is extended or adjusted under 35 U.S.C. 154(b) by 61 days.

(21) Appl. No.: 10/975,957

(22) Filed: Oct. 29, 2004

(65) Prior Publication Data

US 2005/0104088 A1 May 19, 2005

(30) Foreign Application Priority Data

Nov. 18, 2003 (JP) .............................. 2003-388187

(51) Int. Cl.
*H01L 29/739* (2006.01)
(52) U.S. Cl. ...................... 257/197; 257/565
(58) Field of Classification Search ................. 257/183, 257/197, 198, 565; 438/312, 317
See application file for complete search history.

(56) References Cited

U.S. PATENT DOCUMENTS

| | | | |
|---|---|---|---|
| 6,563,145 B1 * | 5/2003 | Chang et al. ................ | 257/197 |
| 6,756,615 B2 * | 6/2004 | Yoshioka et al. ............ | 257/198 |
| 2002/0079511 A1 | 6/2002 | Tu et al. | |
| 2003/0062538 A1 | 4/2003 | Kudo et al. | |
| 2003/0213973 A1 * | 11/2003 | Yoshioka et al. ............ | 257/183 |

FOREIGN PATENT DOCUMENTS

| | | |
|---|---|---|
| EP | 0 504 925 A | 9/1992 |
| EP | 1 291 923 A | 3/2003 |
| JP | 02-002629 | 1/1990 |
| JP | 7-326629 | 12/1995 |
| JP | 10-321640 | 12/1998 |
| JP | 2002-252344 | 9/2002 |
| JP | 2002-343802 | 11/2002 |
| JP | 2002-359249 | 12/2002 |
| JP | 2003-86602 | 3/2003 |
| JP | 2003-218123 | 7/2003 |
| JP | 2003-219213 | 7/2003 |
| JP | 2003-297849 | 10/2003 |
| JP | 2003-309128 | 10/2003 |
| JP | 2004-022818 | 1/2004 |
| WO | WO 03-088363 | 10/2003 |

OTHER PUBLICATIONS

Machine translation of Japanese document 2004-022818, 16 pages, Mar. 5, 2007.*

(Continued)

*Primary Examiner*—Mark V. Prenty
(74) *Attorney, Agent, or Firm*—McGinn IP Law Group, PLLC

(57) ABSTRACT

A heterojunction bipolar transistor, having a structure in which a subcollector layer of a first conductive type having a higher doping concentration than a collector layer, a collector layer of the first conductive type, a base layer of the second conductive type, and an emitter layer of the first conductive type are deposited, in order, on a semi-insulating semiconductor substrate, and in which a hole barrier layer of semiconductor material with a band gap wider than that of the base layer is inserted between the base layer and the collector layer, so as to be in direct contact with the base layer.

20 Claims, 13 Drawing Sheets

OTHER PUBLICATIONS

Rebecca J. Welty, et al., "Design and Performance of Tunnel Collector HBTs for Microwave Power Amplifiers", IEEE Transactions on Electron Devices, vol. 50, No. 4, Apr. 2003, pp. 894-900.

European Search Report dated Apr. 22, 2005.

Rebecca J. Welty, et al., "Design and Performance of Tunnel Collector HBTs for Microwave Power Amplifiers", IEEE Transactions on Electron Devices, IEEE Inc. New York, US, vol. 50, No. 4, Apr. 2003, pp. 894-900, XP001164883.

Japanese Office Action, dated Oct. 25, 2005, with partial English translation.

Japanese Office Action dated Sep. 26, 2006 with partial English translation.

Japanese Office Action dated May 15, 2007 with partial English translation.

* cited by examiner

RELATED ART

RELATED ART

SEMICONDUCTOR DEVICE

BACKGROUND OF THE INVENTION

1. Field of the Invention

This invention relates to a bipolar transistor, and in particular to a heterojunction type bipolar transistor with reduced offset voltage, reduced turn-on resistance, and improved efficiency as a power amplifier in portable terminals.

2. Description of Related Art

Technological advances in recent years have been attended by the growing use of heterojunction bipolar transistors (HBTs) as power transistors for portable terminals. In order to lengthen the usage time of batteries in portable terminals, it is important that the power-added efficiency of power transistors for portable terminals be improved. In the current-voltage characteristics of an HBT, there exists a region in which, when the collector-emitter voltage VCE is near 0 V, a collector current IC does not flow even if VCE is increased; by reducing this region, the HBT power-added efficiency can be greatly improved. The highest VCE at which IC does not flow is called the offset voltage, and in order to improve efficiency, it is important that the offset voltage, as well as the turn-on resistance, be lowered.

In an example of a low-offset-voltage structure, in the conventional HBT, described in Table 1 of the IEEE Transactions on Electron Devices, Vol. 50 No. 4, 2003, pp. 894-900 (hereafter "prior art example 1"), an InGaP layer with large valence band discontinuity $\Delta E_v$, as well as a GaAs spacer layer formed on top thereof, are adopted between the collector layer and the base layer. The InGaP layer acts as a hole barrier, suppressing the movement of holes between the subcollector and the base. In the structure of the conventional HBT, as shown in FIG. 17, a GaAs collector layer 9a, undoped hole barrier thin film layer 8c, GaAs spacer layer 8d, and base layer 7 are deposited in order on the subcollector layer 10.

The conventional HBT shown in FIG. 3 of U.S. Pat. No. 6,563,145 (hereafter "prior art example 2") is configured similarly to that of prior art example 1. The cross-sectional structure of the conventional HBT disclosed in prior art example 2 is shown in FIG. 18. In this prior art example, a GaAs collector layer 9a, N-type hole barrier thin film layer 8a, N-type δ-doped (also called spike-doped) region 15, GaAs spacer layer 8d, and base layer 7 are deposited in order on the subcollector layer 10. The N-type δ-doped region 15 is provided in order to improve the connection of the conduction band between the N-type hole barrier thin film layer 8a and the GaAs spacer layer 8d.

The conventional HBT disclosed in FIG. 1 of Japanese Unexamined Patent Application Publication No. 2002-252344 (hereafter "prior art example 3") has a collector-up structure, but adopts essentially the same structure as that shown in prior art example 1. The cross-sectional structure of this conventional HBT is shown in FIG. 19. A structure is employed in which a GaAs collector layer 9a, N-type hole barrier thin film layer 8a, GaAs spacer layer 8d, and base layer 7 are formed in order under the InGaAs cap layer 14, which is equivalent to the subcollector layer 10.

These prior art examples essentially adopt a structure in which a hole barrier layer (8a, 8c) and GaAs spacer layer 8d are inserted between the GaAs collector layer 9a and the base layer 7.

Next, operation in a conventional HBT is explained. When, with VCE substantially 0 V, the base voltage VBE is higher than the turn-on voltage, apart from the current flowing from the base electrode 2 to the emitter electrode 1, if the current flowing from the base electrode 2 to the collector electrode 3 is large, then the collector current is negative, that is, current is flowing in the opposite direction. Here, if VCE is increased, the PN junction between base and collector changes from forward-bias to reverse-bias, the current flowing from the base electrode 2 to the collector electrode 3 is reduced, and when VCE exceeds the offset voltage, current flows in the positive direction. Hence in order to lower the offset voltage, when VCE is near 0 V, it is necessary to suppress the current flowing from the base electrode 2 to the collector electrode 3. During normal operation, it is electrons which flow from the collector electrode 3 to the emitter electrode 1 via the base layer 7, and even if the hole current is suppressed in order to reduce the current flowing from the base electrode 2 to the collector electrode 3, there is no adverse effect on the characteristic during normal operation. Hence the formation of a hole barrier, that is, a valence band discontinuity, between the base layer 7 and the subcollector layer 10 is effective for reducing the offset voltage.

A material with a wide band gap is used to form the hole barrier; but normally, in addition to the valence band discontinuity, a conduction band discontinuity also occurs, resulting in the problem that the turn-on resistance is increased. In order to mitigate the effect of the conduction band discontinuity, in the conventional HBT shown in FIG. 17, a GaAs spacer layer 8d is inserted between the undoped hole barrier thin film layer 8c for hole barrier formation and the base layer 7.

FIG. 20 shows a conduction band profile in the conventional HBT of FIG. 17. As a result of inserting the GaAs spacer layer 8d between the undoped hole barrier thin film layer 8c and the base layer 7, electrons flowing from the base layer 7 toward the collector have higher energy than the potential barrier due to the conduction band discontinuity formed in the undoped hole barrier thin film layer 8c, and so are not readily affected by the potential barrier. As a result, it is thought, introduction of the undoped hole barrier thin film layer 8c enables reduction of the turn-on resistance, and so is widely adopted.

However, there are a number of problems with the HBTs disclosed in the prior art examples 1, 2 and 3.

A first problem is the fact that by introducing the GaAs spacer layer 8d, the turn-on resistance, rather than being lowered, is raised. A second problem is that the turn-on resistance when a large current is flowing is increased. A third problem is that the base-collector capacitance is increased.

SUMMARY OF THE INVENTION

The present invention has recognized that a heterojunction bipolar transistor, having a structure in which a first conductive type subcollector layer with a doping concentration higher than a collector layer, a first conductive type collector layer, a second conductive type base layer, and a first conductive type emitter layer are formed, in order, on a semi-insulating semiconductor substrate, wherein a hole barrier layer of semiconductor material with a band gap wider than that of the base layer is inserted between the base layer and collector layer, so as to be in direct contact with the base layer.

First, the ability of this invention to reduce the turn-on resistance compared with the prior art is demonstrated. FIG. 10 shows a conduction band profile which illustrates the action of this invention. FIG. 11 shows the conduction band profile of prior art example 1, shown in FIG. 17. FIG. 9 schematically shows the conduction band profile and electric field strength in moving from the base layer 7 toward the GaAs collector layer 9a. The electric field strength is strongest at the edge of the base layer 7, and tends to decline on moving away from the edge. Hence in the prior art example 1 shown in FIG. 17, because of the existence of the GaAs spacer layer 8d, the electric field in the undoped hole barrier thin film layer 8c is weakened. On the other hand, because the N-type hole barrier thin film layer 8a exists at the edge of the base layer 7, an extremely strong electric field is felt. As is seen from the conduction band profile in FIG. 10, a strong electric field causes an inclination in the potential, so that a substantially triangular potential barrier shape is formed, and it is seen that, in effect, the potential barrier width is greatly reduced. On the other hand, as is seen from the conduction band profile of FIG. 11, in the prior art example 1 the electric field felt by the undoped hole barrier thin film layer 8c is weak, and the potential barrier width remains substantially unchanged with changing thickness of the undoped hole barrier thin film layer 8c. FIG. 12 schematically show in enlargement the conduction band profiles near the N-type hole barrier thin film layer 8a. FIG. 13 schematically show in enlargement the conduction band profiles near the undoped hole barrier thin film layer 8c. In prior art example 1, as is seen from FIG. 13, the potential barrier width felt by electrons and by holes is the same. On the other hand, in this invention, as is seen from FIG. 12, because the band discontinuity of the valence band is comparatively large, the potential barrier width felt by holes is substantially the same as in prior art example 1, but because the band discontinuity of the conduction band is comparatively small, the potential barrier shape is close to a triangular potential barrier shape, and the potential barrier width is greatly decreased. As a result, compared with the prior art example 1, in this invention electrons flow more readily from the base to the collector layer, and so the turn-on resistance can be reduced. The actually measured turn-on resistance is, in the case of prior art example 1, $8.9 \times 10^{-6}$ $\Omega$-cm$^2$, and in the case of the invention shown in FIG. 1, this is reduced to $6.1–10^{\times 6}$ $\Omega$-cm$^2$, so that the turn-on resistance is lower for the structure of this invention. This result indicates that during low-VCE operation, electrons are not flowing, as in the model shown in FIG. 20 and adopted in the past. In other words, even if the potential of the conduction band in the undoped hole barrier thin film layer 8c is made lower than the base, in actuality the turn-on resistance is not made lower. During low VCE operation, the kinetic energy of electrons moving from the base layer 7 toward the GaAs collector layer 9a is low, so that as a result of electron motion near the bottom potential of the conduction band, even if the potential position of the undoped hole barrier thin film layer 8c is made lower than that of the base layer, the potential barrier arising due to the conduction band discontinuity remains in existence, so that, it is thought, the turn-on resistance is not lowered.

Next, it is shown that in this invention the turn-on resistance does not tend to worsen, even at large currents, compared with the prior art. In the prior art example 1 shown in FIG. 17, the hole barrier is distant from the base layer 7, so that as the collector current increases the amount of space charge increases, and consequently holes are injected into the GaAs spacer layer 8d, the electric field felt by the GaAs spacer layer 8d drops sharply, and electron velocities are reduced. As a result, the turn-on resistance tends to increase with increasing collector current. On the other hand, because in this invention there is an N-type hole barrier thin film layer 8a in contact with the base layer 7, holes in the base layer 7 are not readily injected into the GaAs collector layer 9a, so that even during large-current operation the electric field felt by the GaAs collector layer 9a does not readily decline. As a result, in this invention an increase in turn-on resistance arising due to an increase in collector current can be suppressed compared with the prior art.

Next, it is shown that the base-collector capacitance is reduced compared with the prior art. In the schematic diagram (FIG. 20) of the conduction band profile of the prior art example 1 shown in FIG. 17, there is a potential valley on the conduction band between the GaAs spacer layer 8d and the undoped hole barrier thin film layer 8c, so that charge is concentrated and the amount of space charge is increased. As a result, the base-collector capacitance is increased. On the other hand, in this invention an N-type hole barrier thin film layer 8a which is a hole barrier layer is positioned in contact with the base layer 7, so that an increase in capacitance such as that seen in the examples of the prior art does not occur.

Next, the action of the P-type δ-doped region and of the P++ GaAs layer is explained. The newly added P-type δ-doped region 12 and P++ GaAs layer 17 can raise the built-in potential with the N-type hole barrier thin film layer 8a. By this means, the electric field felt by the N-type hole barrier thin film layer 8a can be increased, so that the turn-on resistance can be further lowered.

As explained above, a first advantageous result of this invention is the ability to provide a semiconductor device which, while lowering the offset voltage, lowers the turn-on resistance, to realize a high power-added efficiency. This is because, by placing a hole barrier layer employing semiconductor material with a wide band gap in direct contact with the base layer, the potential barrier arising on the conduction band side of the hole barrier layer can be made a triangular potential barrier, and the turn-on resistance can be lowered.

A second advantageous result is the ability to provide a semiconductor device in which the base-collector capacitance can be reduced, so that a high power gain is realized. This is because there is no spacer layer between the base layer and hole barrier layer, so that accumulation of carriers occurring between the hole barrier and the spacer layer does not occur.

A third advantageous result is the ability to improve the collector-emitter breakdown voltage during intermediate-current operation in the vicinity of a current density of 10 kA/cm$^2$. This is because, by inserting semiconductor layers with wide band gaps at two places in the collector, near the interface with the subcollector layer and in contact with the interface with the base layer, holes formed by ionization collisions and scattering are confined within the collector. As a result, the conduction band is raised, the electric field is concentrated in a wide band gap semiconductor layer in which ionization collisions and scattering do not readily occur, and so the breakdown voltage is increased.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS (First Aspect)

Figure 1:
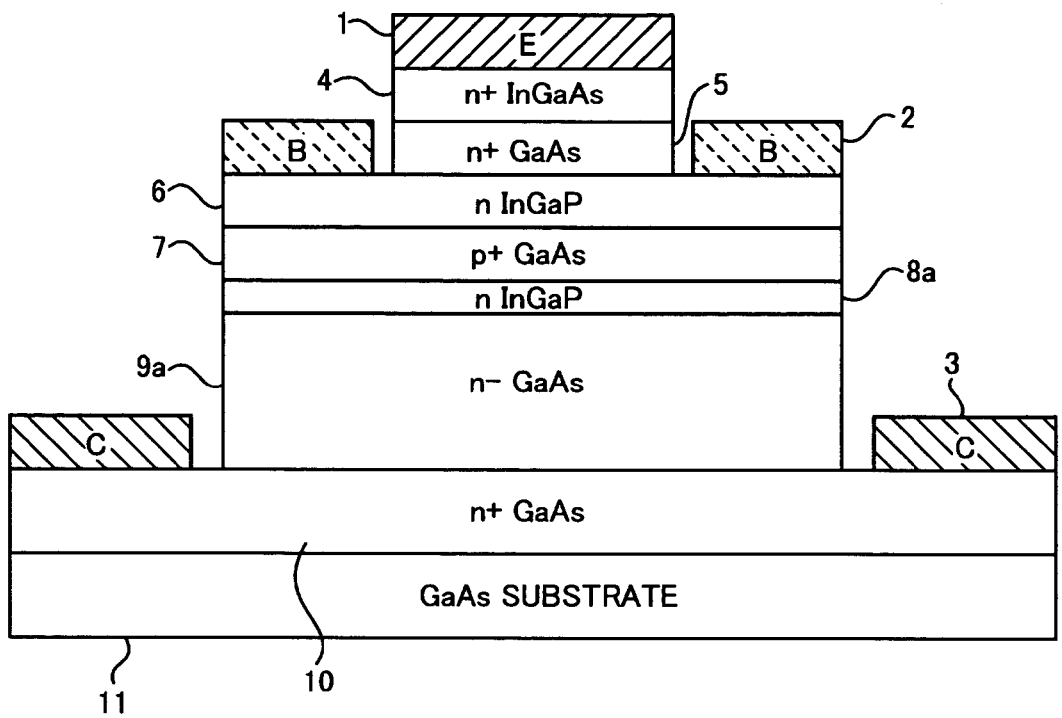
FIG. 1 is a cross-sectional view showing the structure of a heterojunction bipolar transistor of a first embodiment of this invention.

Next, a first aspect of the invention is explained in detail, referring to the figures. In FIG. 1, a cross-sectional view of a semiconductor device of the first aspect of this invention is shown. In this invention, a subcollector layer 10 and GaAs collector layer 9a are formed on a GaAs substrate 11 which is the semi-insulating semiconductor substrate. On this subcollector layer 10 and GaAs collector layer 9a are deposited, in order, an N-type hole barrier thin film layer 8a and a base layer 7. The N-type hole barrier thin film layer 8a is in contact with the base layer 7, as a result of which diffusion of holes from the base layer 7 into the GaAs collector layer 9a is suppressed. By this means, of the current flowing from the base electrode 2 to the collector electrode 3, the current component due to holes is greatly suppressed, contributing to reduction of the offset voltage. Further, by placing an N-type hole barrier thin film layer 8a at the edge of the base layer 7, at which the electric field strength is highest between the base layer 7 and the subcollector layer 10, the width of the potential barrier formed by the conduction band discontinuity can be reduced, so that the turn-on resistance can be lowered. Here, because the valence band discontinuity is greater than the conduction band discontinuity, there is little effect by reduction of the potential barrier width due to the effect of deformation of the potential barrier by the strong electric field. Consequently even if the N-type hole barrier thin film layer 8a is placed in a region with a strong electric field, the hole barrier effect remains nearly unchanged, and a satisfactory offset voltage reduction effect can be obtained. Further, through the N-type hole barrier thin film layer 8a the diffusion of holes in the base layer 7 toward the GaAs collector layer 9a can be prevented, so that increases in the turn-on resistance during large-current operation can also be suppressed.

Embodiment 1

Figure 14:
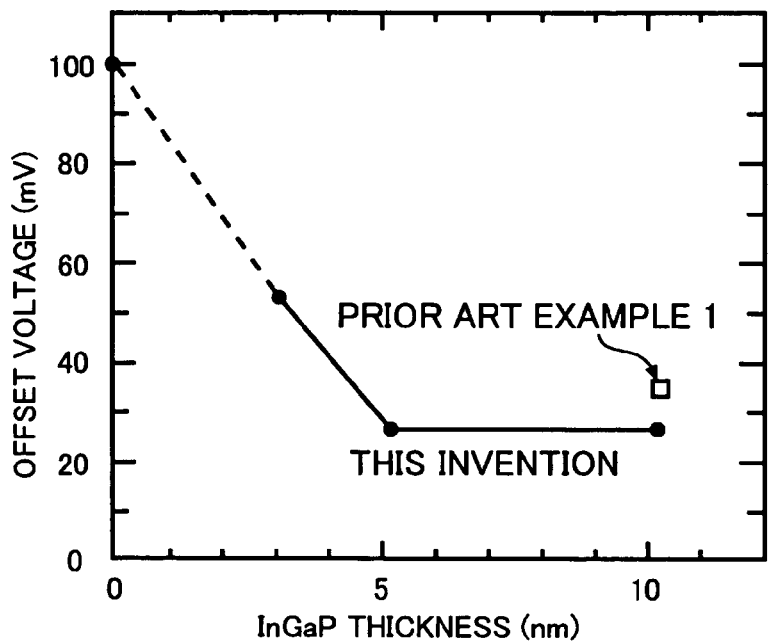
FIG. 14 shows the InGaP layer thickness of the N-type hole barrier thin film layer 8a versus the offset voltage in the first embodiment of this invention.
Figure 15:
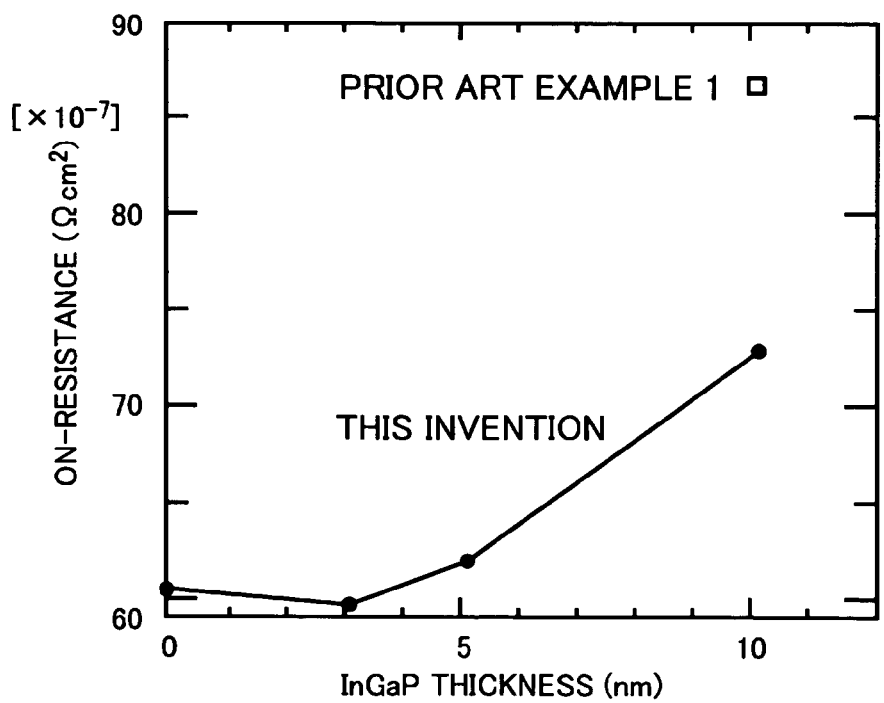
FIG. 15 shows the InGaP layer thickness of the N-type hole barrier thin film layer 8a versus the turn-on resistance in the first embodiment of this invention.
Figure 16:
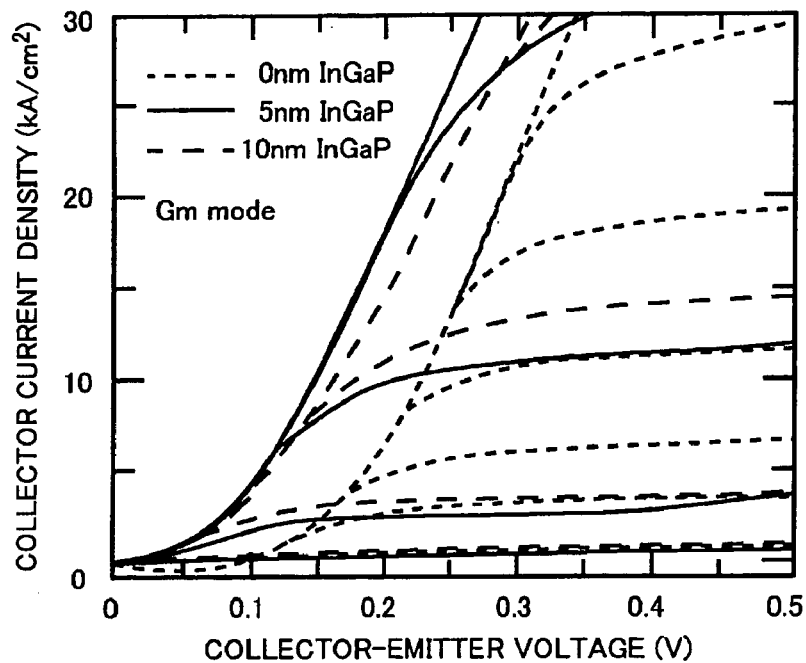
FIG. 16 shows current-voltage characteristics illustrating an advantageous result of this invention.
Figure 17:
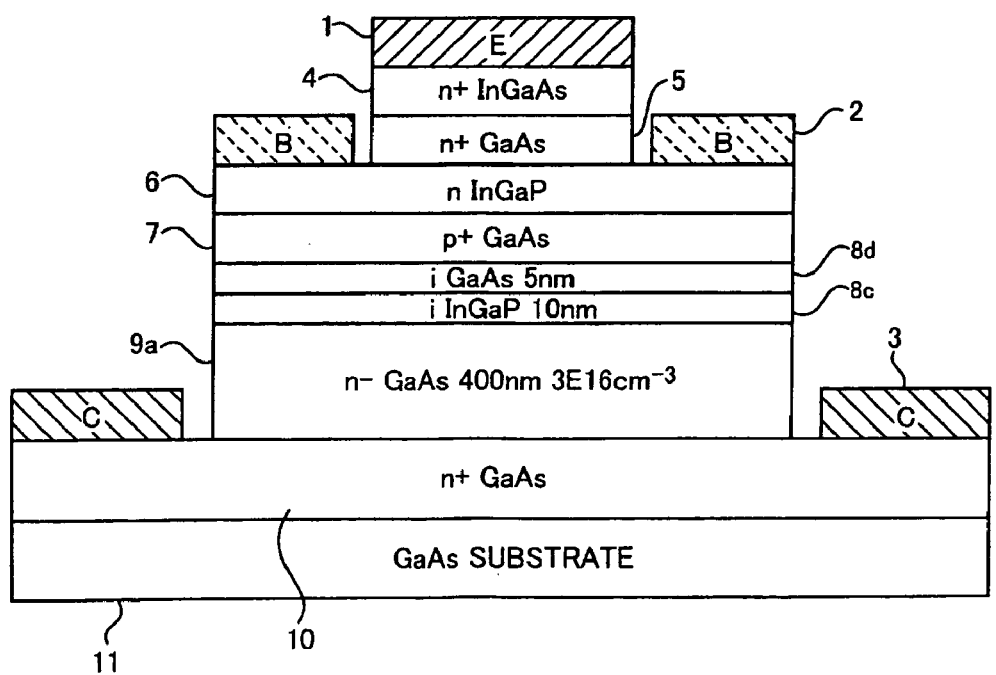
FIG. 17 shows the cross-sectional structure of the heterojunction bipolar transistor of prior art example 1.
Figure 18:
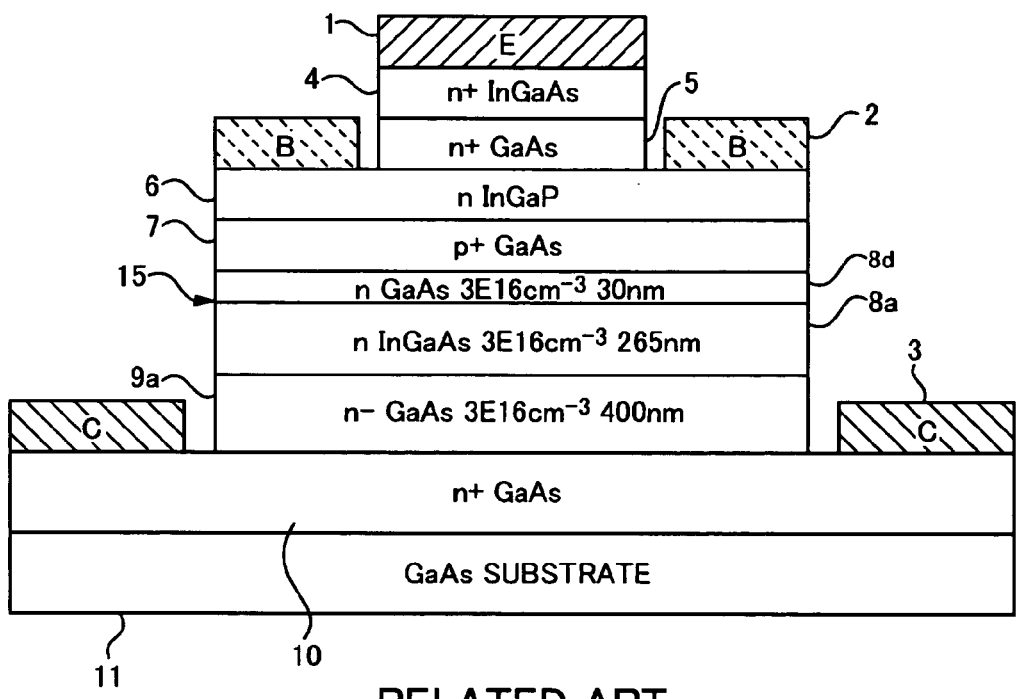
FIG. 18 shows the cross-sectional structure of the heterojunction bipolar transistor of prior art example 2.
Figure 19:
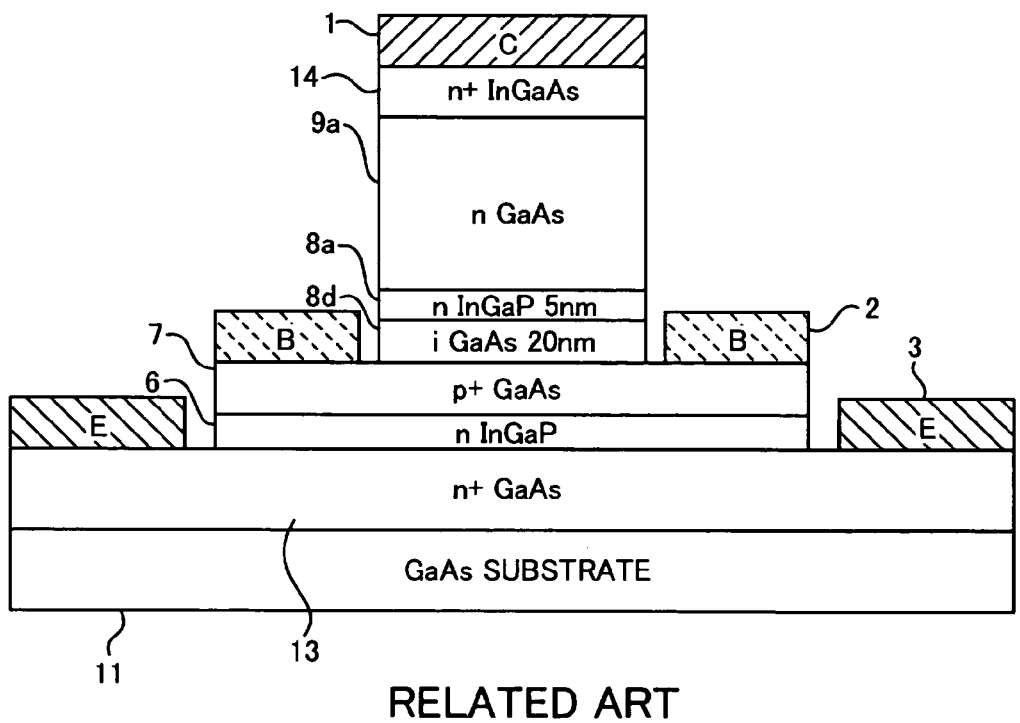
FIG. 19 shows the cross-sectional structure of the heterojunction bipolar transistor of prior art example 3.
Figure 20:
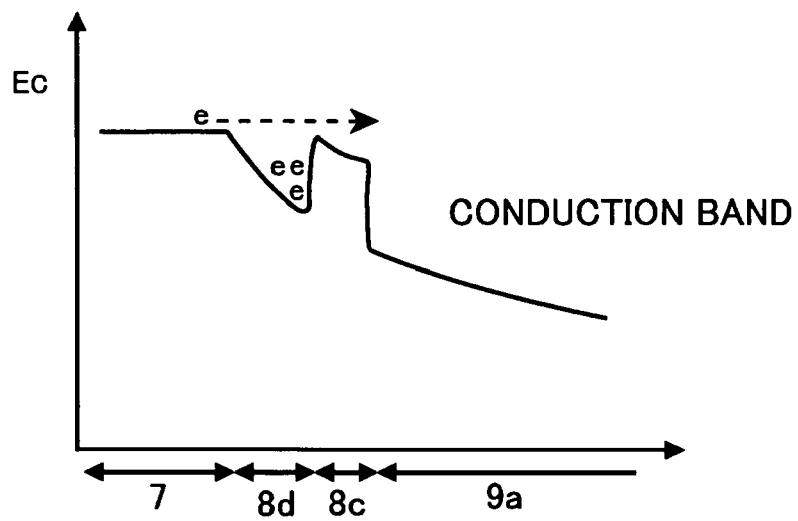
FIG. 20 is a schematic diagram of a conduction band profile used to explain the operating principle of the heterojunction bipolar transistor of prior art example 1.
Figure 21:
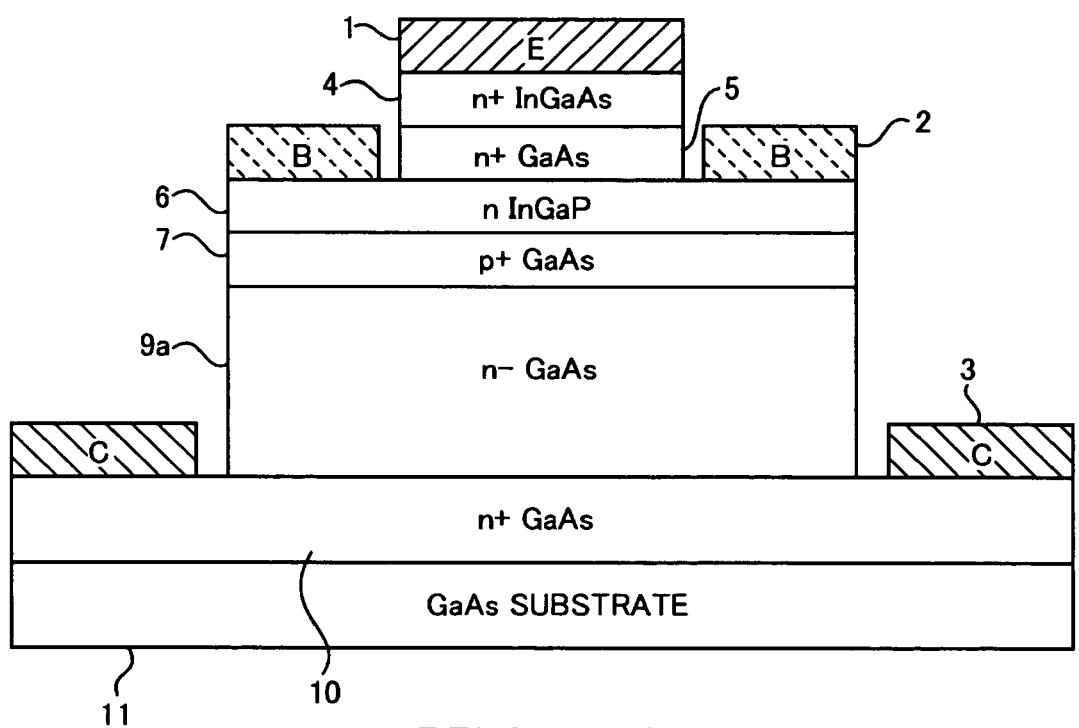
FIG. 21 shows the cross-sectional structure of a heterojunction bipolar transistor of a prior art example; and, FIG. 22 is a schematic diagram of a conduction band profile during large-current and intermediate-current operation.

Embodiment 1, based on the first aspect of this invention, is explained in detail referring to FIG. 1 and to FIG. 14 through FIG. 16 illustrating advantageous results of the invention. FIG. 16 shows current-voltage characteristics in Gm mode. The vertical axis plots the collector current density; the horizontal axis plots the layer thickness of the N-type hole barrier thin film layer 8a in FIG. 1 of this invention. The N-type hole barrier thin film layer 8a used in these measurements had a doping concentration of $2 \times 10^{18}$ cm$^{-3}$, and was an ordering-system In$_{0.48}$Ga$_{0.52}$P with a band gap of 1.85 eV. Here "ordering-system" denotes growth under grown conditions such that a natural superlattice is formed in the InGaP layer. An ordering-system has a somewhat lower band gap $E_g$ compared with a disordering-system, but has a smaller conduction band discontinuity. As a result, from the standpoint of reducing the turn-on resistance, it is preferable to use ordering-system InGaP as the N-type hole barrier thin film layer 8a. The GaAs collector layer 9a is 800 nm thick GaAs doped to $5 \times 10^{15}$ cm$^{-3}$. The base layer 7 is 80 nm thick GaAs doped to $4 \times 10^{19}$ cm$^{-3}$, and the InGaP emitter layer 6 is 30 nm thick In$_{0.48}$Ga$_{0.52}$P doped to $3 \times 10^{17}$ cm$^{-3}$. The GaAs emitter cap layer 5 and subcollector layer 10 are both GaAs layers doped to $4 \times 10^{18}$ cm$^{-3}$. In FIG. 16, the dashed-line data denoted by "0 nm InGaP" is the result of evaluation of the prior art example of FIG. 21. This prior art example differs only in that the N-type hole barrier thin film layer 8a of this invention has not been inserted. The offset voltage of the prior art example shown in FIG. 21 is 100 mV. On the other hand, the offset voltages of the device of the solid-line data for this invention, in which the N-type hole barrier thin film layer 8a is of thickness 5 nm (denoted in the figure by "5 nm InGaP"), and of the device of the dashed-line data for which the layer thickness is 10 nm (denoted by "10 nm InGaP" in the figure), are both 27 mV, so that the offset voltage has been lowered considerably. FIG. 14 is a graph which plots the thickness of the N-type hole barrier thin film layer 8a in FIG. 1 along the horizontal axis and the offset voltage along the vertical axis. The evaluation results for the prior art example 1 shown in FIG. 17 are also plotted. From the standpoint of the offset voltage, it is desirable that the thickness of the N-type hole barrier thin film layer 8a be 4 nm or greater. On the other hand, FIG. 15 is a graph which plots the turn-on resistance along the vertical axis to show the slope of the rising characteristics in FIG. 16. The horizontal axis shows the thickness of the N-type hole barrier thin film layer 8a. In the prior art example 1 of FIG. 17 the turn-on resistance is high, but in the case of the structure of this invention, because the N-type hole barrier thin film layer 8a is in direct contact with the base layer 7, the turn-on resistance is lowered. Because when the thickness of the N-type hole barrier thin film layer 8a becomes 10 nm the turn-on resistance increases by 20% or more over the value at 5 nm, it is desirable that the thickness of the N-type hole barrier thin film layer 8a be less than 10 nm. Based on the above results, it is suitable that the layer thickness of the N-type hole barrier thin film layer 8a be 4 nm or greater, but less than 10 nm.

(Second Aspect)

Figure 2:
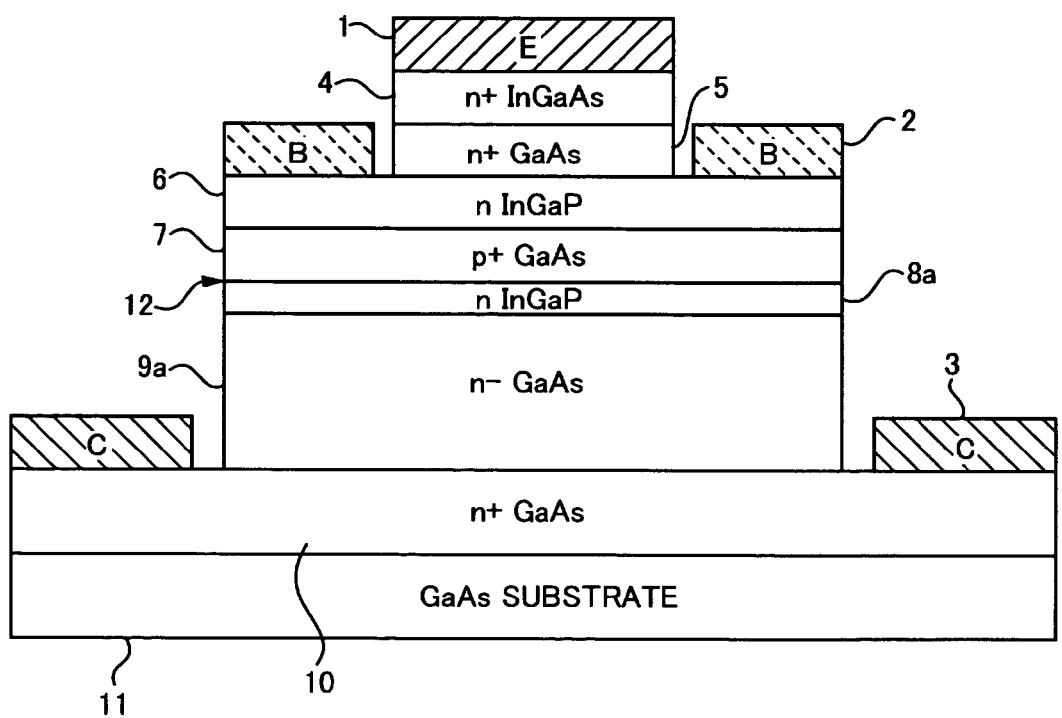
FIG. 2 is a cross-sectional view showing the structure of a heterojunction bipolar transistor of a second embodiment of this invention.
Figure 3:
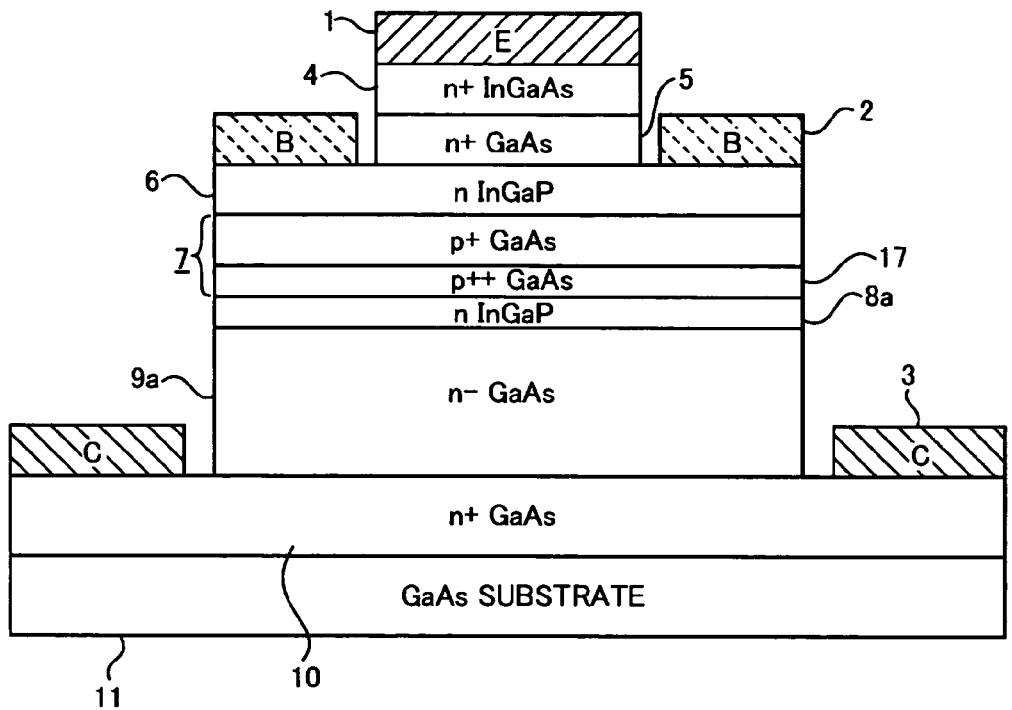
FIG. 3 is a cross-sectional view showing the structure of a heterojunction bipolar transistor of a third embodiment of this invention.

Next, a second aspect of the invention is explained in detail, referring to FIG. 2 and FIG. 3. Explanation of portions of the configuration which are similar to those of the first aspect is omitted. In the second aspect, a P-type δ-doped region 12 is provided at the interface of the base layer 7 and the N-type hole barrier thin film layer 8a, as shown in FIG. 2, or, a P++ GaAs layer 17 is provided on the N-type hole barrier thin film layer 8a of the base layer 7, as shown in FIG. 3. Here, the acceptor concentration in the P++ GaAs layer 17 is set to be higher than the acceptor concentration in other regions of the base layer 7. The object of the P-type δ-doped region 12 and of the P++ GaAs layer 17 is to raise the built-in potential of the PN junction by raising the acceptor concentration in the region in contact with the N-type hole barrier thin film layer 8a; hence the layer thickness of the P++ GaAs layer 17 should be thicker than the depletion layer width formed by the built-in potential. When the acceptor concentration of the P++ GaAs layer 17 is $10^{19}$ cm$^{-3}$ or higher, the depletion layer broadens hardly at all, so that a P++ GaAs layer 17 thickness of 5 nm is sufficient.

Embodiment 2

Embodiment 2, based on the second aspect, is explained using FIG. 2. In Embodiment 2, an N-type In$_{0.48}$Ga$_{0.52}$P layer 5 nm thick, doped with Si to $2\times10^{18}$ cm$^{-3}$, is formed as the N-type hole barrier thin film layer 8a on the N-type GaAs collector layer 9a, doped to $5\times10^{15}$ cm$^{-3}$. This InGaP layer is ordering-system InGaP with a band gap of 1.85 eV. An 80 nm thick P-type GaAs layer with an acceptor concentration of $4\times10^{19}$ cm$^{-3}$ is formed on the N-type hole barrier thin film layer 8a, and P-type δ doping is performed at the interface with the N-type hole barrier thin film layer 8a. The δ-doping sheet concentration of P-type δ-doped region 12 is $1\times10^{12}$ cm$^{-2}$. It is seen that the turn-on resistance is reduced, from the $6.1\times10^{-6}$ Ω-cm$^2$ when a P-type δ-doped region 12 is not formed, to $5.5\times10^{-6}$ Ω-cm$^2$ when a P-type δ-doped region 12 is formed.

Embodiment 3

Embodiment 3, based on the second aspect, is explained using FIG. 3. A difference with the structure shown in FIG. 2 is the insertion, in place of the P-type δ-doped region 12, of a P++ GaAs layer 17. As the P++ GaAs layer 17, GaAs 5 nm thick, doped to $4.2\times10^{19}$ cm$^{-3}$, is used. Because other regions of the base layer 7 are doped to $4\times10^{19}$ cm$^{-3}$, the increase in the acceptor concentration due to introduction of the P++ GaAs layer 17 is $1\times10^{12}$ cm$^{-3}$. The turn-on resistance at this time is $5.5\times10^{-6}$ Ω-cm$^2$, so that a low value equivalent to that of Embodiment 2 is obtained.

(Third Aspect)

In the first and second aspects of the invention, the N-type hole barrier thin film layer 8a can be configured as an undoped hole barrier thin film layer. This configuration is explained as a third aspect of the invention. Explanation of portions of the configuration which are similar to those of the first and second aspects is omitted. In the third aspect, the N-type hole barrier thin film layer 8a in FIG. 1 through FIG. 3 is changed to an undoped hole barrier thin film layer in which there is no N-type doping. The undoped hole barrier thin film layer has a somewhat lower built-in potential, due to the lower donor concentration compared with an N-type hole barrier thin film layer 8a. Consequently the electric field in the undoped hole barrier thin film layer is somewhat lower. As a result the turn-on resistance is increased somewhat, but the turn-on resistance is substantially lower than that of prior art example 1 in FIG. 17, and advantageous results of the invention are obtained.

Embodiment 4

Embodiment 4, based on the third aspect, is explained below. In FIG. 1, in place of the N-type hole barrier thin film layer 8a, an undoped, ordering-system In$_{0.48}$Ga$_{0.52}$P layer 5 nm thick, with a band gap of 1.85 eV, is used. At this time the turn-on resistance is $6.8\times10^{-6}$ Ω-cm$^2$. The turn-on resistance when using the N-type hole barrier thin film layer 8a shown in FIG. 1 is $6.1\times10^{-6}$ Ω-cm$^2$, so that there is an increase of approximately 10% in the turn-on resistance; but the value for prior art example 1 shown in FIG. 17 is $8.9\times10^{-6}$ Ω-cm$^2$, so that in this Embodiment 4 also, a substantial effect in lowering the turn-on resistance is seen.

(Fourth Aspect)

Figure 22:
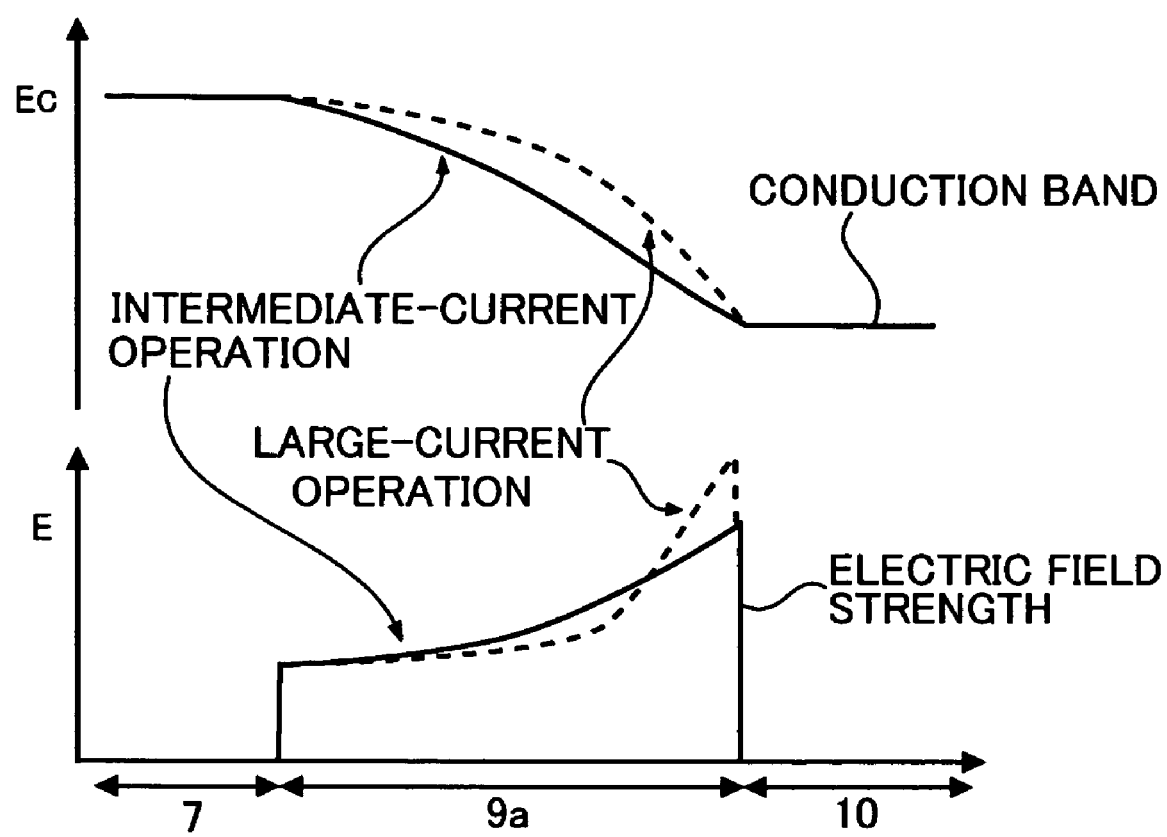

In the fourth aspect of the invention, in addition to the above-described first, second and third aspects of the invention, an InGaP collector layer 9c of semiconductor material with a band gap wider than that of the GaAs collector layer 9a is inserted between the GaAs collector layer 9a and the subcollector layer 10. The fourth aspect is explained referring to FIG. 4. The InGaP collector layer 9c is introduced in order to improve the breakdown voltage during large-current operation (collector current density 20 kA/cm$^2$). In the large-current operating state, as shown in FIG. 22, the conduction band in the collector layer 9a becomes swelled midway, the electric field weakens near the base layer 7, and conversely, as the subcollector layer 10 is approached the electric field strengthens. Consequently the breakdown voltage during large-current operation is essentially determined by avalanche breakdown within the collector layer next to the subcollector layer 10. Because ionization collisions and scattering do not occur readily in the wide band gap InGaP collector layer 9c, avalanche breakdown can be substantially suppressed, and the breakdown voltage can be improved. However, in general in a semiconductor with a wide band gap the effective mass of electrons is large and electron mobilities are low, and high-resistance regions are easily formed, so that in FIG. 4 the wide band gap InGaP collector layer 9c is placed only in the region in which the electric field is strong. However, given this configuration, during intermediate-current operation (collector current density 10 kA/cm$^2$) the high-electric field region extends from the InGaP collector layer 9c to the GaAs collector layer 9a, and there is the possibility that the breakdown voltage may decline. In this invention, an n-type hole barrier thin film layer 8a is present, so that when a strong electric field is felt in the GaAs collector layer 9a the electric field strength declines automatically, and to this extent the electric field is redistributed to the wide band gap InGaP collector layer 9c, so that the breakdown voltage during intermediate-current operation can be improved effectively.

In this invention, because of the presence of the N-type hole barrier thin film layer 8a, holes formed by ionization collisions and scattering in the GaAs collector layer 9a cannot escape to the base layer 7, and so holes accumulate in the GaAs collector layer 9a. Through hole accumulation, the potential of the GaAs collector layer 9a is raised, the electric field strength is automatically declined, and to this declined the electric field is felt in the wide band gap InGaP collector layer 9c. As a result, the breakdown voltage during intermediate-current operation can be improved. Hence 1) through introduction of an N-type hole barrier thin film layer 8a, the offset voltage and turn-on resistance can be decreased; and 2) by means of a structure in which an InGaP collector layer 9c, of semiconductor material with a band gap wider than that of the GaAs collector layer 9a, is inserted between the GaAs collector layer 9a and the subcollector layer 10, the breakdown voltage during large-current operation is improved. Combining these two configurations, a new advantageous result, which is that the breakdown voltage during intermediate-current operation can be improved, is obtained.

Embodiment 5

Figure 4:
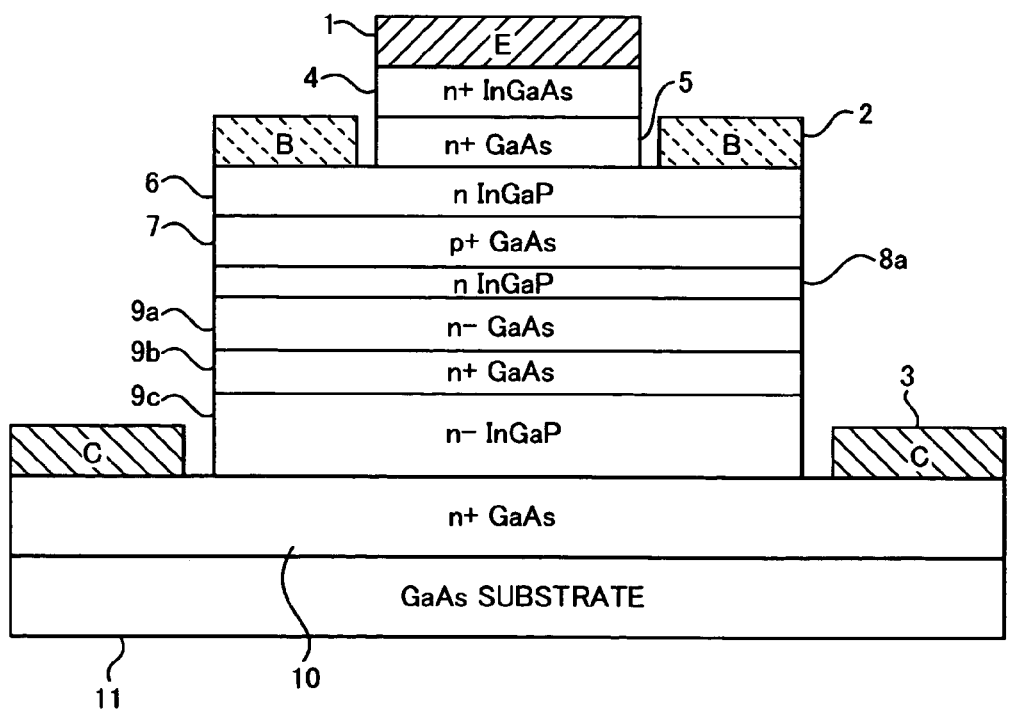
FIG. 4 is a cross-sectional view showing the structure of a heterojunction bipolar transistor of a fifth embodiment of this invention.

Embodiment 5, based on the fourth aspect, is explained referring to FIG. 4. In Embodiment 5, an InGaP collector layer 9c, N+ GaAs collector layer 9b, GaAs collector layer 9a, N-type hole barrier thin film layer 8a, and base layer 7 are formed, in order, on the subcollector layer 10, which is N-type GaAs doped to 4×10$^{18}$ cm$^{-3}$. As the InGaP collector layer 9c, an In$_{0.48}$Ga$_{0.52}$P layer, with a band gap wider than that of the GaAs collector layer 9a, is used. The doping concentration of the InGaP collector layer 9c is 1×10$^{16}$ cm$^{-3}$, and the layer thickness is 100 nm. Because InGaP has lower electron mobility than does GaAs, if the thickness is increased too much, a high-resistance region is formed and there is the problem that the turn-on resistance is worsened. The N+ GaAs collector layer 9b is used to smoothly connect the conduction bands between the InGaP collector layer 9c and the GaAs collector layer 9a. The N+ GaAs collector layer 9b is a 5 nm thick n+ GaAs layer doped to 3×10$^{18}$ cm$^{-3}$. The GaAs collector layer 9a is 700 nm thick GaAs doped to 3×10$^{17}$ cm$^{-3}$. The N-type hole barrier thin film layer 8a is a hole barrier layer of In$_{0.48}$Ga$_{0.52}$P, 5 nm thick, doped to 2×10$^{18}$ cm$^{-3}$. The base layer 7 is 80 nm thick P-type GaAs doped to 4×10$^{19}$ cm$^{-3}$. During large-current operation, there no different in the collector-emitter breakdown voltage depending on whether an N-type hole barrier thin film layer 8a is present or not, and the collector-emitter breakdown voltage is 13 V in both case. But during intermediate-current operation, when the collector current density is 10 kA/cm$^2$, the breakdown voltage, which is 16 V when there is no N-type hole barrier thin film layer 8a, is improved to 18 V in Embodiment 5, so that the advantageous result of improvement of the breakdown voltage is observed.

Embodiment 6

Figure 5:
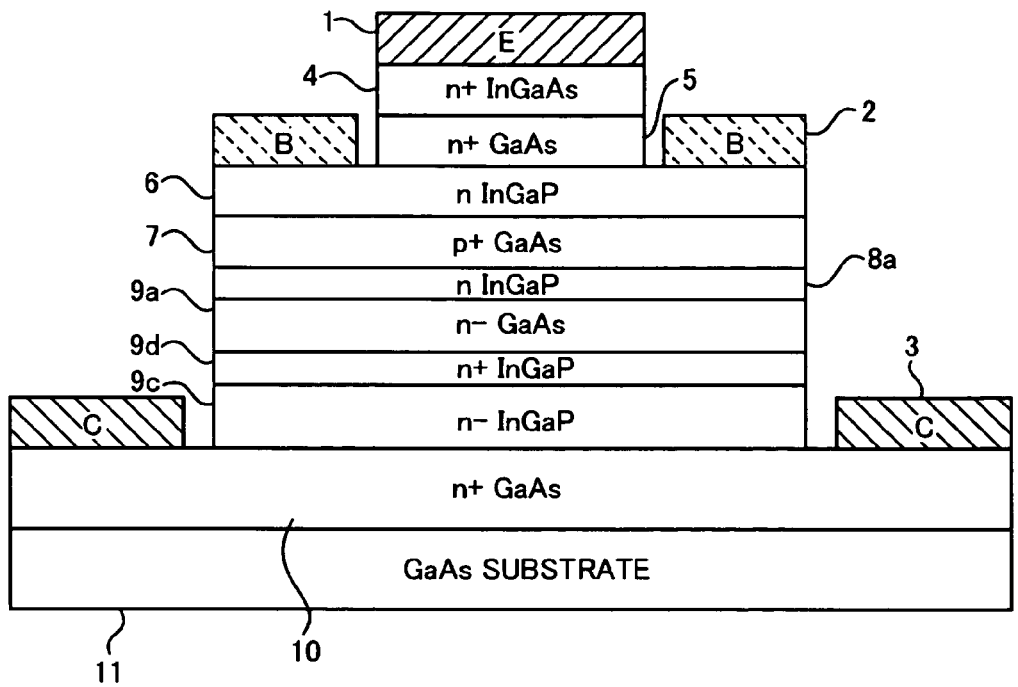
FIG. 5 is a cross-sectional view showing the structure of a heterojunction bipolar transistor of a sixth embodiment of this invention.

Embodiment 6, based on the fourth aspect, is shown in FIG. 5. A difference with Embodiment 5 is that the N+ GaAs collector layer 9b is changed to an N+ InGaP collector layer 9d. The N+ InGaP collector layer 9d, like the N+ GaAs collector layer 9b, is used to smoothly connect the conduction bands between the InGaP collector layer 9c and the GaAs collector layer 9a. The N+ InGaP collector layer 9d is a 5 nm thick N-type In$_{0.48}$Ga$_{0.52}$P layer doped to 2×10$^{18}$ cm$^{-3}$. The turn-on resistance was the same as the value for Embodiment 5.

Embodiment 7

Figure 6:
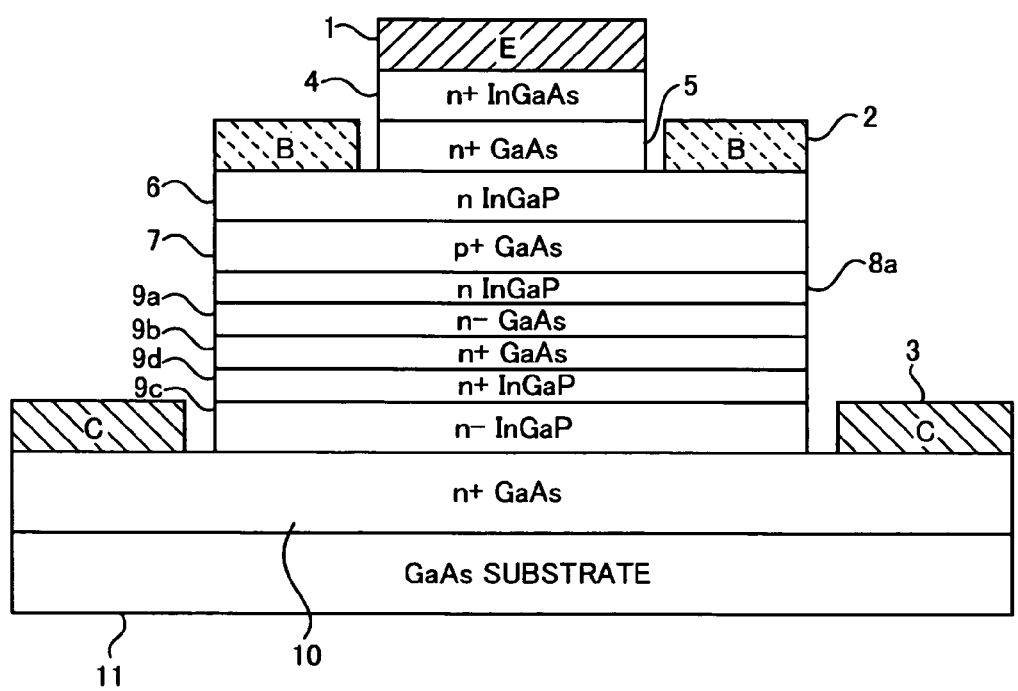
FIG. 6 is a cross-sectional view showing the structure of a heterojunction bipolar transistor of a seventh embodiment of this invention.

Embodiment 7, based on the fourth aspect, is shown in FIG. 6. A difference with Embodiment 6 is that an N+ GaAs collector layer 9b is inserted between the GaAs collector layer 9a and the N+ InGaP collector layer 9d.

Embodiment 8

Figure 7:
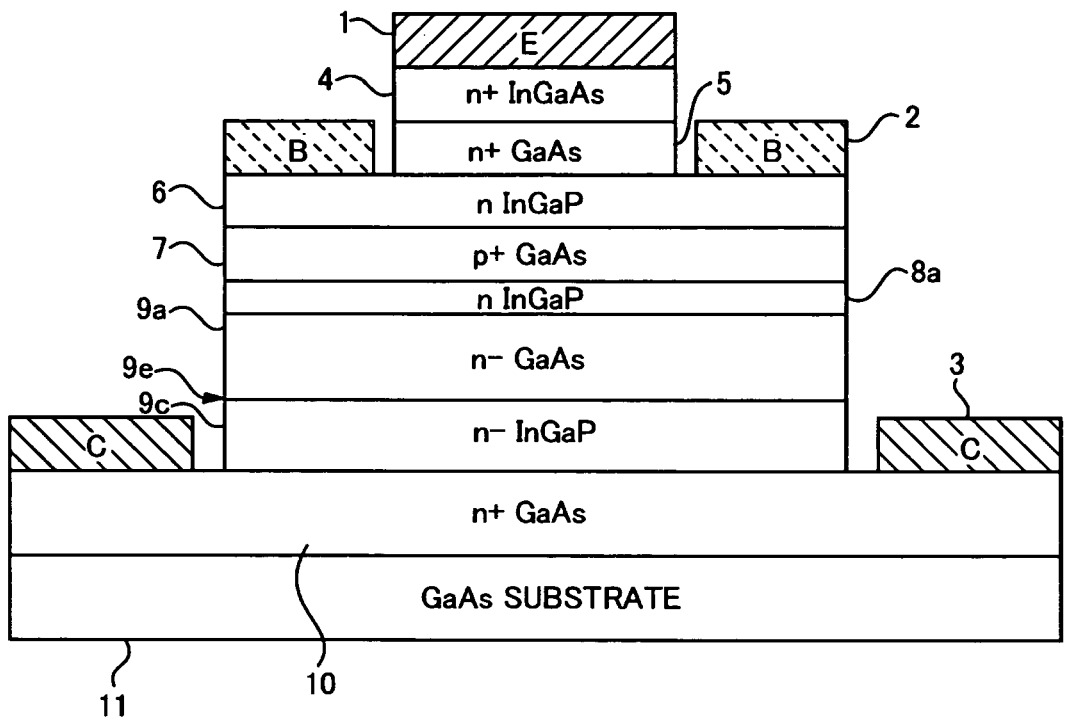
FIG. 7 is a cross-sectional view showing the structure of a heterojunction bipolar transistor of an eighth embodiment of this invention.

Embodiment 8, based on the fourth aspect, is shown in FIG. 7. A difference with Embodiment 6 is that, in place of the N+ InGaP collector layer 9d, an N-type δ-doped region 9e is used.

Embodiment 9

Embodiment 9 has a structure in which a P-type δ-doped region 12 is added between the N-type hole barrier thin film layer 8a and base layer 7 in Embodiments 5 through 8.

Embodiment 10

Figure 8:
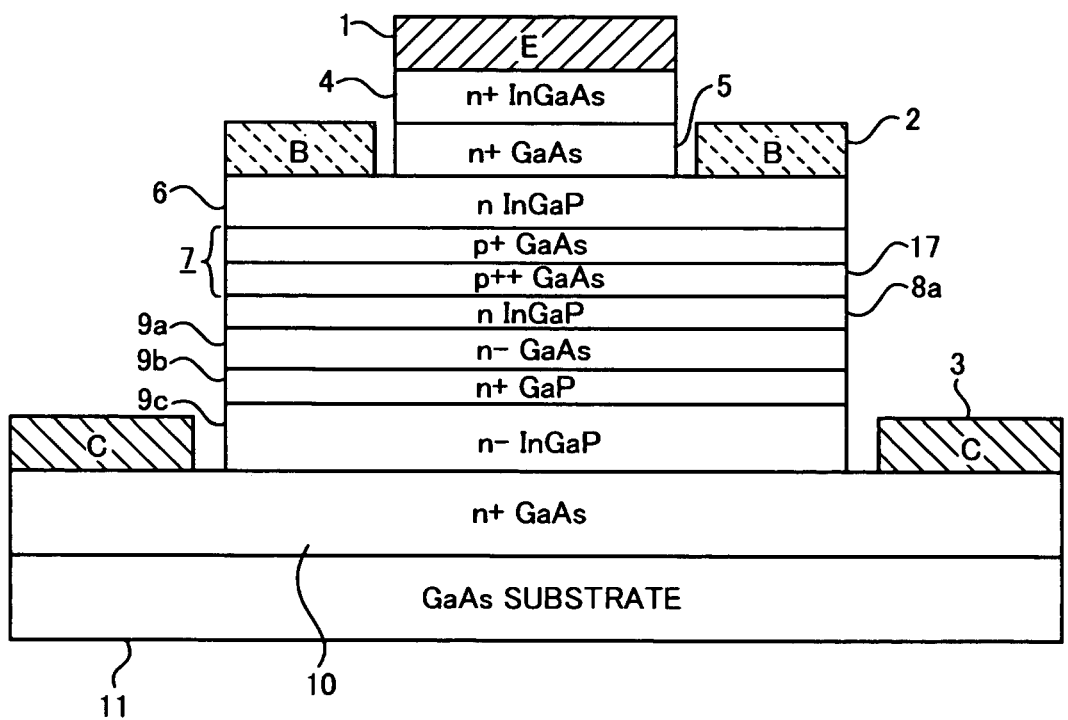
FIG. 8 is a cross-sectional view showing the structure of a heterojunction bipolar transistor of a tenth embodiment of this invention.
Figure 9:
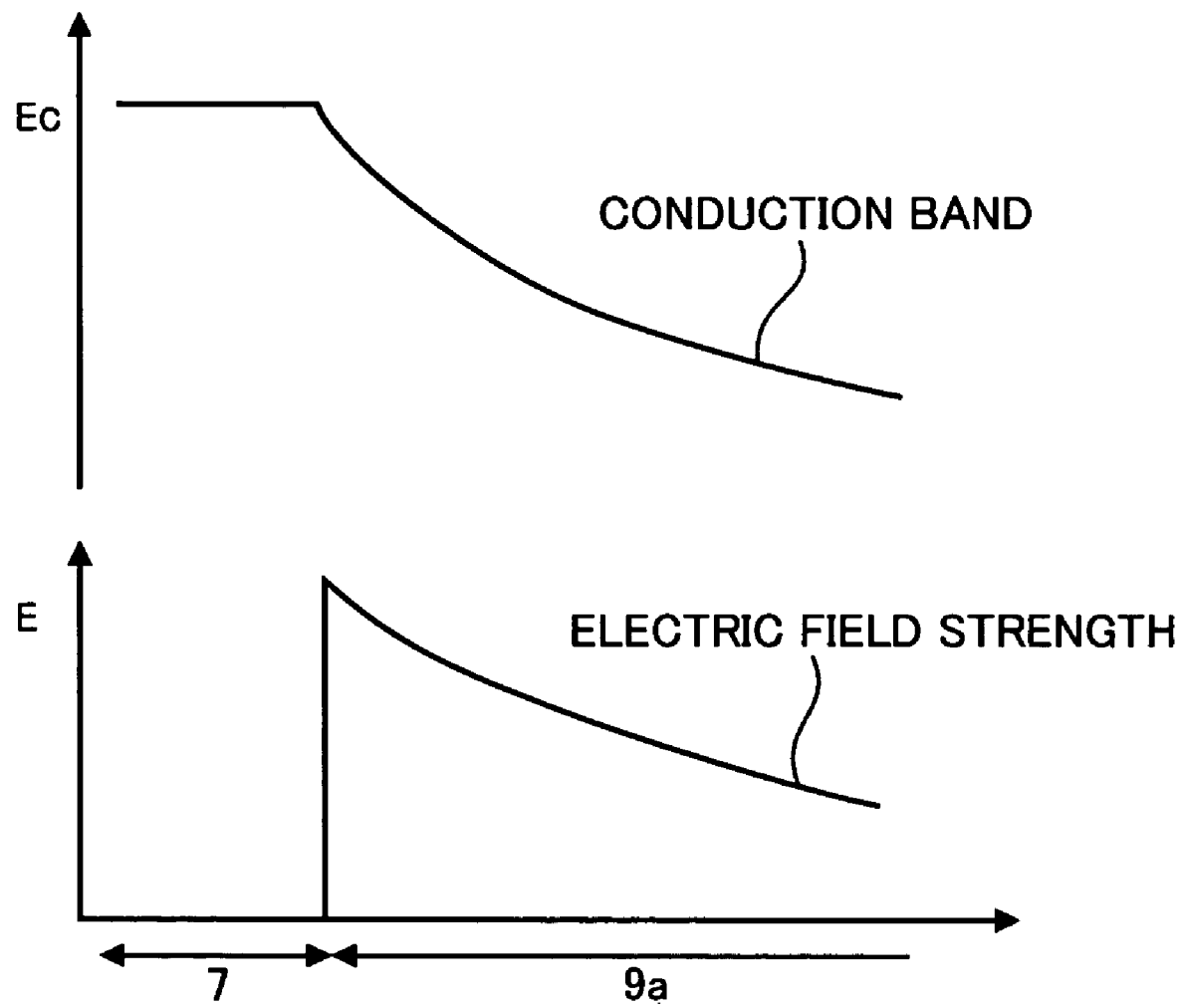
FIG. 9 shows a conduction band profile and electric field strength profile near the base-collector interface.
Figure 10:
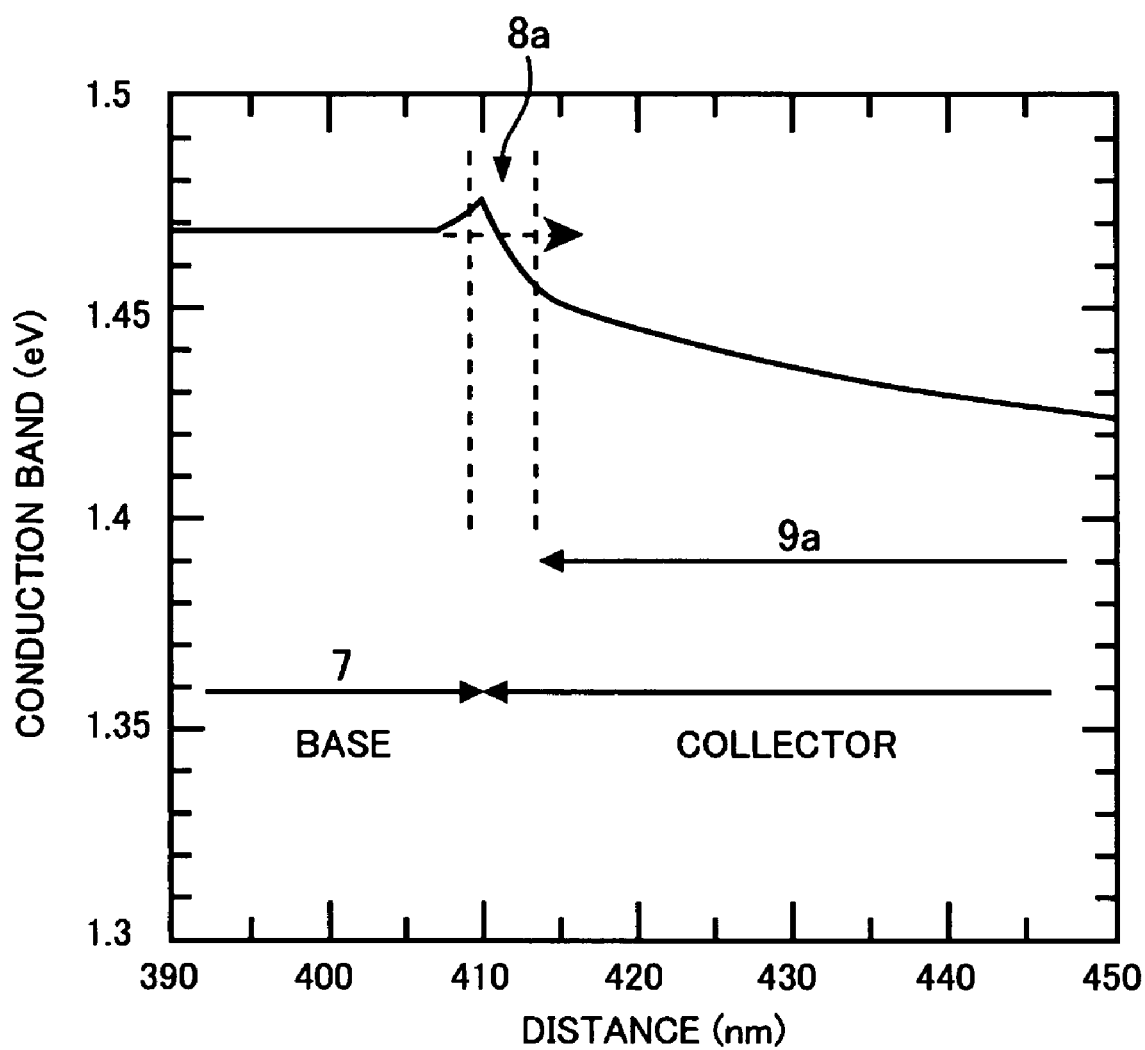
FIG. 10 shows a conduction band profile near the base-collector interface in the first embodiment of this invention.
Figure 11:
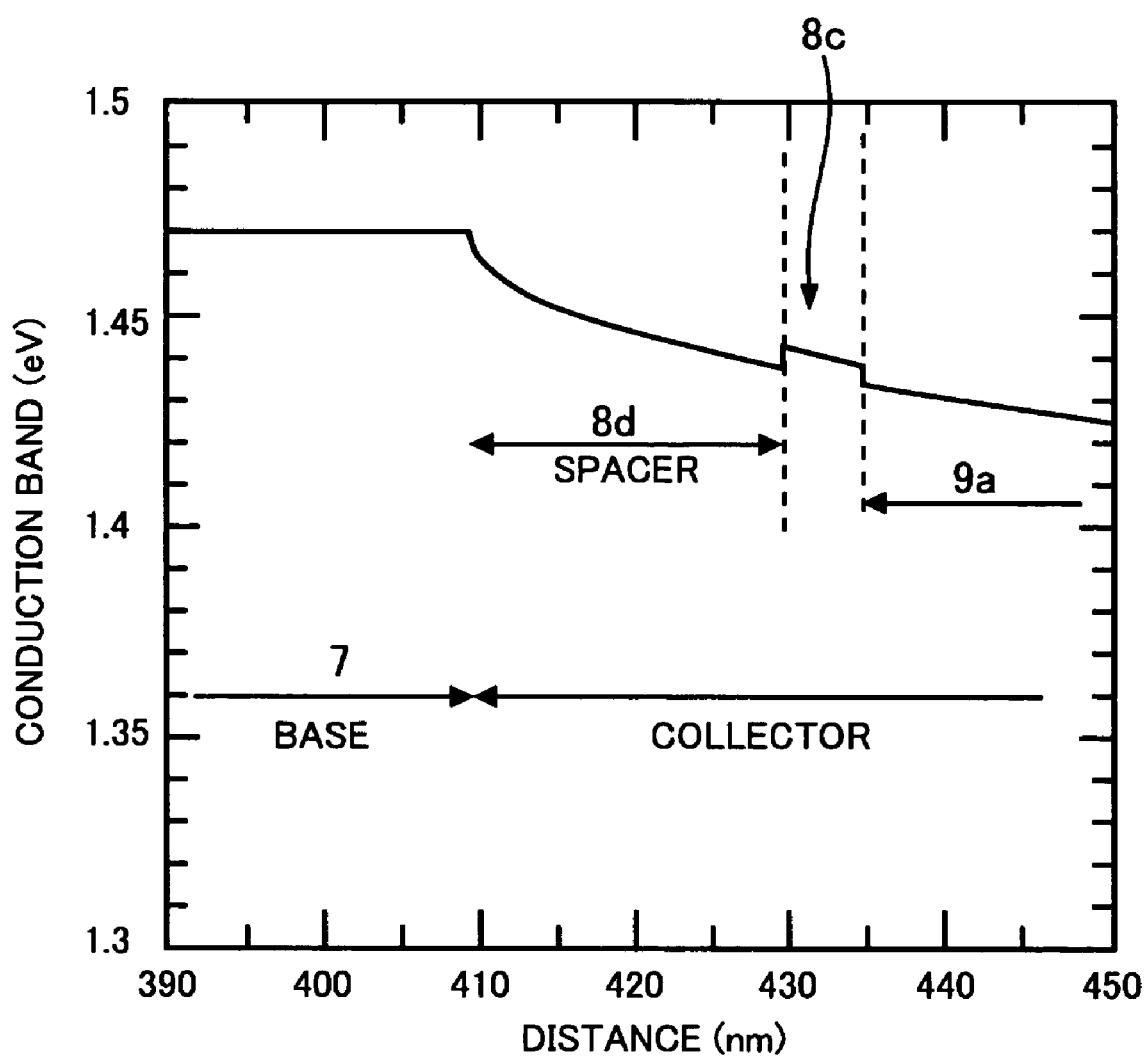
FIG. 11 shows a conduction band profile near the base-collector interface in the prior art example 1.
Figure 12:
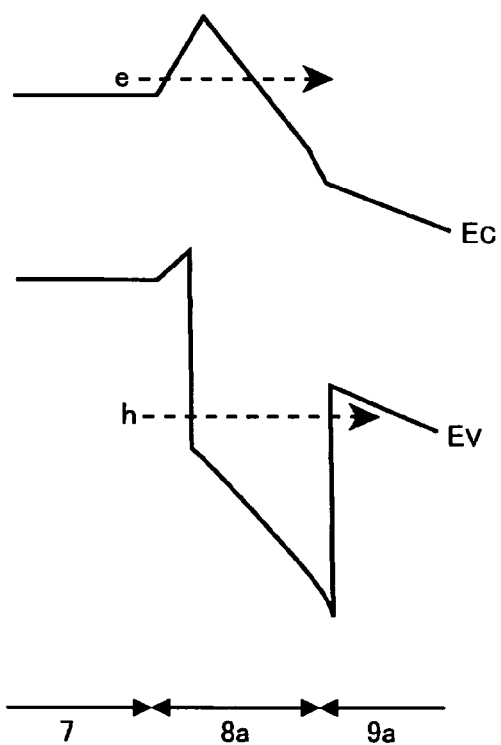
FIG. 12 shows schematically in enlargement the band profile near the base-collector interface in the first embodiment of this invention.
Figure 13:
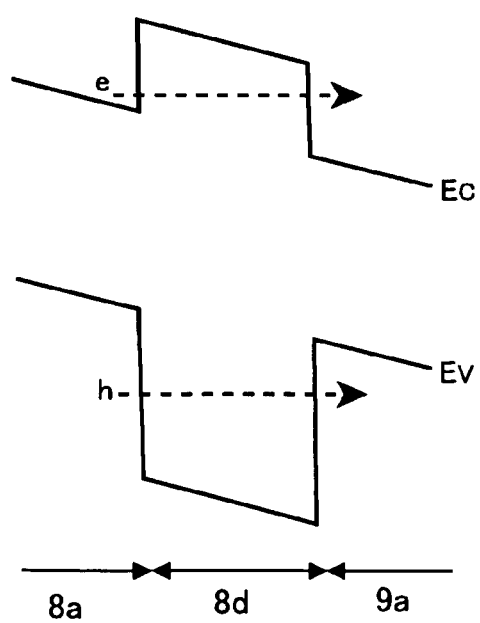
FIG. 13 shows schematically in enlargement the band profile near the base-collector interface in the prior art example 1.

Embodiment 10 has a structure further comprising a P++ GaAs layer 17 on the side of the N-type hole barrier thin film layer 8a of the base layer 7 in Embodiments 5 through 8. FIG. 8 shows a structure comprising a P++ GaAs layer 17 on the side of the N-type hole barrier thin film layer 8a of the base layer 7 in Embodiment 5.

In the embodiments of this invention, In$_{0.48}$Ga$_{0.52}$P is used, as a layer with a wide band gap, as the N-type hole barrier thin film layer 8a and as the InGaP collector layers 9c and 9d; however, the band gap need only be wider than that of GaAs. For example AlGaAs, InP, InAlGaAs, or GaInAsN may also be used as a layer with a wide band gap.

Examples of utilization of this invention are semiconductor devices employed in power amplification for portable telephone terminals and portable telephone base stations.

It is apparent that the present invention is not limited to the above embodiment, that may be modified and changed without departing from the scope and spirit of the invention.

What is claimed is:

1. A heterojunction bipolar transistor comprising:
   a first conductive type collector layer;
   a first conductive type subcollector layer with a doping concentration higher than the collector layer;

a second conductive type base layer;

a first conductive type emitter layer, wherein the first conductive type subcollector layer, the second conductive type base layer, and the first conductive type emitter layer are formed, in order, on a semi-insulating semiconductor substrate; and a hole barrier layer of semiconductor material with a band gap wider than that of the second conductive type base layer is disposed between the second conductive type base layer and the first conductive type collector layer, such that the hole barrier layer is in direct contact with the second conductive type base layer, wherein a thickness of said hole barrier layer is 4 nm or greater, and less than 10 nm.

2. The heterojunction bipolar transistor according to claim 1, wherein the interface between the hole barrier layer and the base layer is delta-doped with an impurity of the second conductive type.

3. The heterojunction bipolar transistor according to claim 1, wherein the base layer comprises, on the side in contact with the hole barrier layer, a semiconductor layer, the concentration of the second conductive type impurity of which is higher than in other regions within the base layer.

4. The heterojunction bipolar transistor according to claim 1, wherein the hole barrier layer is the first conductive type or a non-doped layer.

5. The heterojunction bipolar transistor according to claim 1, wherein a first semiconductor layer, with a band gap wider than the collector layer, is located between the collector layer and the subcollector layer.

6. The heterojunction bipolar transistor according to claim 1, wherein the hole barrier layer comprises an InGaP layer, including a natural superlattice formed in the InGaP layer.

7. A heterojunction bipolar transistor comprising:

a first conductive type collector layer;

a first conductive type subcollector layer with a doping concentration higher than the collector layer;

a second conductive type base layer;

a first conductive type emitter layer, wherein the first conductive type subcollector layer, the second conductive type base layer, and the first conductive type emitter layer are formed, in order, on a semi-insulating semiconductor substrate; and a hole barrier layer of semiconductor material with a band gap wider than that of the second conductive type base layer is disposed between the second conductive type base layer and the first conductive type collector layer, such that the hole barrier layer is in direct contact with the second conductive type base layer, wherein a semiconductor layer, with a band gap wider than the collector layer, is located between the collector layer and the subcollector layer, and the semiconductor layer comprises an InGaP layer, including a natural superlattice formed in the InGaP layer.

8. The heterojunction bipolar transistor according to claim 5, wherein a second semiconductor layer, including an impurity concentration higher than that of the first semiconductor layer, is located between the first semiconductor layer and the collector layer.

9. The heterojunction bipolar transistor according to claim 8, wherein the second semiconductor layer comprises one of GaAs and InGaP.

10. The heterojunction bipolar transistor according to claim 5, wherein the interface between the first semiconductor layer and the collector layer is delta-doped with an impurity of the first conductive type.

11. The heterojunction bipolar transistor according to claim 1, wherein the hole barrier layer comprises a doping concentration of $2 \times 10^{18}$ cm$^{-3}$, and an ordering-system $In_{0.48}Ga_{0.52}P$ with a band gap of 1.85 eV.

12. The heterojunction bipolar transistor according to claim 1, wherein the first conductive type collector layer comprises 800 nm thick GaAs doped to $5 \times 10^{15}$ cm$^{-3}$.

13. The heterojunction bipolar transistor according to claim 1, wherein the second conductive base layer comprises 80 nm thick GaAs doped to $4 \times 10^{19}$ cm$^{-3}$.

14. The heterojunction bipolar transistor according to claim 1, wherein the first conductive emitter layer comprises 30 nm thick $In_{0.48}Ga_{0.52}P$ doped to $3 \times 10^{17}$ cm$^{-3}$.

15. The heterojunction bipolar transistor according to claim 1, wherein the first conductive type subcollector layer comprises GaAs doped to $4 \times 10^{18}$ cm$^{-3}$.

16. The heterojunction bipolar transistor according to claim 1, wherein an offset voltage is less than 30 mV when the thickness of the hole barrier layer comprises 5 nm or greater, and less than 10 nm.

17. The heterojunction bipolar transistor according to claim 1, wherein a turn-on resistance is less than $65 \times 10^{-7}$ $\Omega$-cm$^2$ when a thickness of the hole barrier layer is approximately 5 nm.

18. The heterojunction bipolar transistor according to claim 1, wherein the band gap of the emitter layer is wider than the band gap of the base layer.

19. A heterojunction bipolar transistor comprising:

a first conductive type collector layer;

a first conductive type subcollector layer with a doping concentration higher than the collector layer;

a second conductive type base layer;

a first conductive type emitter layer, wherein the first conductive type subcollector layer, the second conductive type base layer, and the first conductive type emitter layer are formed, in order, on a semi-insulating semiconductor substrate; and a hole barrier layer of semiconductor material with a band gap wider than that of the second conductive type base layer is disposed between the second conductive type base layer and the first conductive type collector layer, such that the hole barrier layer is in direct contact with the second conductive type base layer;

a first semiconductor layer, with a band gap wider than the collector layer, is located between the collector layer and the subcollector layer; and a second semiconductor layer, including an impurity concentration higher than that of the first semiconductor layer, is located between the first semiconductor layer and the collector layer.

20. A heterojunction bipolar transistor comprising:

a first conductive type collector layer;

a first conductive type subcollector layer with a doping concentration higher than the collector layer;

a second conductive type base layer;

a first conductive type emitter layer, wherein the first conductive type subcollector layer, the second conductive type base layer, and the first conductive type emitter layer are formed, in order, on a semi-insulating semiconductor substrate; and a hole barrier layer of semiconductor material with a band gap wider than that of the second conductive type base layer is disposed between the second conductive type base layer and the first conductive type collector layer, such that the hole barrier layer is in direct contact with the second conductive type base layer;

a first semiconductor layer, with a band gap wider than the collector layer, is located between the collector layer and the subcollector layer; and a second semiconductor layer, comprised of one of GaAs and InGaP, is located between the first semiconductor layer and the collector layer.

* * * * *

UNITED STATES PATENT AND TRADEMARK OFFICE
CERTIFICATE OF CORRECTION

PATENT NO. : 7,304,333 B2  
APPLICATION NO. : 10/975957  
DATED : December 4, 2007  
INVENTOR(S) : Takaki Niwa Page 1 of 1

It is certified that error appears in the above-identified patent and that said Letters Patent is hereby corrected as shown below:

Title page 1, Item (73) Assignee should be changed from:

(73) Assignee: NEC Compound Semiconductor Devices, Ltd., Kawasaki-shi, Kanagawa (JP)

to

(73) Assignee: NEC Electronics Corporation, Kawasaki, Kanagawa (JP)

Signed and Sealed this

Sixteenth Day of December, 2008

JON W. DUDAS  
*Director of the United States Patent and Trademark Office*